United States Patent
Kuratli et al.

(10) Patent No.: US 10,192,798 B2
(45) Date of Patent: Jan. 29, 2019

(54) INTEGRATED CIRCUIT DIE HAVING A SPLIT SOLDER PAD

(71) Applicant: EM Microelectronic-Marin SA, Marin (CH)

(72) Inventors: Christoph Kuratli, Guemmenen (CH); Yves Dupraz, Valeyres-sous-Montagny (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 15/678,186

(22) Filed: Aug. 16, 2017

(65) Prior Publication Data
US 2018/0053699 A1 Feb. 22, 2018

(30) Foreign Application Priority Data
Aug. 17, 2016 (EP) .................................... 16184545

(51) Int. Cl.
*H01L 23/00* (2006.01)
*H01L 21/66* (2006.01)
(Continued)

(52) U.S. Cl.
CPC ........ *H01L 22/32* (2013.01); *G01R 31/31715* (2013.01); *G01R 31/31937* (2013.01);
(Continued)

(58) Field of Classification Search
CPC ................... H01L 23/492–23/49866
See application file for complete search history.

(56) References Cited

U.S. PATENT DOCUMENTS 5,787,098 A 7/1998 Dasgupta et al.
5,854,513 A * 12/1998 Kim ........................ H01L 24/11
257/734
(Continued)

FOREIGN PATENT DOCUMENTS

| EP | 0 880 171 A2 | 11/1998 |
| JP | 59-193046 | 11/1984 |
| JP | 10-223679 | 8/1998 |

OTHER PUBLICATIONS

European Search Report dated May 10, 2017 in European Application 16184545.8, filed on Aug. 17, 2016.

*Primary Examiner* — William Harriston
(74) *Attorney, Agent, or Firm* — Oblon, McClelland, Maier & Neustadt, L.L.P.

(57) ABSTRACT

An electronic system is provided, including an integrated circuit die having at least 2 bond pads, and a redistribution layer having at least one solder pad including 2 portions separated from each other and configured to provide an electrical connection between each of the 2 portions by a solder ball disposed on the solder pad, and to electrically isolate the 2 portions in an absence of the solder ball on the solder pad, and at least 2 redistribution wires, each connecting a different one of the portions to a different one of the bond pads, a second bond pad being connected via a second redistribution wire to a second portion being dedicated to die testing; and a grounded printed circuit board track, wherein the solder ball is disposed between the solder pad and the track, and neither of the redistribution wires traverses a separation space between the 2 portions.

2 Claims, 1 Drawing Sheet

(51) Int. Cl.
*H01L 23/31* (2006.01)
*H01L 23/528* (2006.01)
*G01R 31/317* (2006.01)
*G01R 31/3193* (2006.01)
*H01L 23/525* (2006.01)

(52) U.S. Cl.
CPC ........ *H01L 23/3114* (2013.01); *H01L 23/528* (2013.01); *H01L 23/5286* (2013.01); *H01L 24/05* (2013.01); *H01L 24/06* (2013.01); *H01L 24/09* (2013.01); *H01L 24/16* (2013.01); *H01L 24/17* (2013.01); *H01L 24/48* (2013.01); *H01L 23/525* (2013.01); *H01L 24/49* (2013.01); *H01L 2224/02371* (2013.01); *H01L 2224/02375* (2013.01); *H01L 2224/02377* (2013.01); *H01L 2224/0401* (2013.01); *H01L 2224/04042* (2013.01); *H01L 2224/05015* (2013.01); *H01L 2224/05548* (2013.01); *H01L 2224/05551* (2013.01); *H01L 2224/05552* (2013.01); *H01L 2224/05554* (2013.01); *H01L 2224/0603* (2013.01); *H01L 2224/06051* (2013.01); *H01L 2224/06167* (2013.01); *H01L 2224/131* (2013.01); *H01L 2224/13028* (2013.01); *H01L 2224/1613* (2013.01); *H01L 2224/16106* (2013.01); *H01L 2224/16227* (2013.01); *H01L 2224/48227* (2013.01); *H01L 2224/49113* (2013.01); *H01L 2224/49175* (2013.01); *H01L 2924/00014* (2013.01)

(56) References Cited

U.S. PATENT DOCUMENTS

| | | | |
|---|---|---|---|
| 5,986,345 | A | 11/1999 | Monnot |
| 7,586,199 | B1 | 9/2009 | Leistiko et al. |
| 8,405,220 | B1 | 3/2013 | Loeb et al. |
| 2003/0045026 | A1 | 3/2003 | Fogal et al. |
| 2009/0080135 | A1 | 3/2009 | Major |
| 2009/0134902 | A1 | 5/2009 | Law |
| 2012/0228763 | A1 | 9/2012 | Akiyama et al. |
| 2013/0127042 | A1* | 5/2013 | Lee .................. H01L 23/49838 257/737 |
| 2014/0061900 | A1* | 3/2014 | Park .................. H01L 21/4853 257/737 |
| 2014/0332811 | A1 | 11/2014 | Kumar et al. |

\* cited by examiner

INTEGRATED CIRCUIT DIE HAVING A SPLIT SOLDER PAD

This application claims priority from European patent application No. 16184545.8 filed on Aug. 17, 2016, the entire disclosure of which is hereby incorporated herein by reference.

FIELD OF THE INVENTION

The invention relates to a pad for a solder ball, called solder pad, in a redistribution layer of an integrated circuit die.

BACKGROUND OF THE INVENTION

An integrated circuit (IC) die (also called chip) is classically put into a protective package acting as a mechanical interface between said integrated circuit die and a printed circuit board (PCB). A very large number of different types of package exist, which are basically separated into two main techniques.

In the traditional wire-bond packaging technique, illustrated in FIGS. 1 and 2, an integrated circuit die 10 is placed into a protective package 12 and bond pads 9 of said integrated circuit die 10 are connected to pins 11 of said protective package 12 via tiny bond wires 13. These pins 11 are in turn connected to tracks 14 of a printed circuit board 15.

In the more recent flip-chip technique, illustrated in FIG. 3, the integrated circuit die 10 is directly connected to the printed circuit board 15 via solder balls 16 (or solder bumps). In this technique, solder balls 16 are placed onto solder pads 17 of the integrated circuit die 10. Then, the integrated circuit die 10 is flipped and placed onto the printed circuit board 15, the solder balls establishing electrical connections between the solder pads 17 and the tracks 14. As can be seen in FIG. 4, such an integrated circuit die 10 comprises an extra metal layer, called redistribution layer (RDL). The redistribution layer comprises redistribution wires 18 connecting the solder pads 17 to the input/output bond pads 14 of the integrated circuit die 10. As it is classically practiced, a bond pad 20 is dedicated to the digital ground (VSS), and another bond pad 37 is dedicated to test the die 10. Such a test is usually performed by connecting a test circuitry to the dedicated test bond pad 37 of the die 10.

There is a need to prevent a testing of the die after a flip-chip packaging operation while saving a solder ball.

SUMMARY OF THE INVENTION

It is an object of the invention to meet the aforementioned need. Therefore, the invention relates to an electronic system comprising an integrated circuit die, as defined in claim 1.

The integrated circuit die according to the invention behaves differently either there is a solder ball on the split solder pad or not. Such a die may be used for applications in which an integrated circuit die is needed to behave differently before and after an operation of flip-chip packaging. Thus, the split solder pad of the integrated circuit die according to the invention may be used to prevent a testing of the die after a flip-chip packaging operation while saving a solder ball.

As previously mentioned, such a test is usually performed by connecting a test circuitry to a dedicated test bond pad of the die. By using the split solder pad, the test bond pad may be grounded after packaging. This is done by connecting the test bond pad to a first portion of the solder pad and connecting the VSS bond pad to a second portion of the solder pad (c.f. FIG. 5). As long as no solder ball is placed onto the solder pad, the test in enabled. However, when a solder ball connects the first and the second portions, the test bond pad and the VSS bond pads are merged, and the chip can no longer be tested.

In an embodiment, the solder pad is made of two demi-disks.

BRIEF DESCRIPTION OF THE DRAWINGS

Other features and advantages of the present invention will appear more clearly upon reading the following detailed description, made with reference to the annexed drawings given by way of non-limiting examples.

DETAILED DESCRIPTION OF THE PREFERRED EMBODIMENTS

Figure 1:
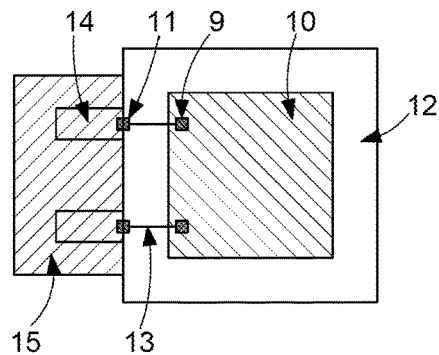
FIG. 1 schematically illustrates a top view of a classical wire-bond package
Figure 2:
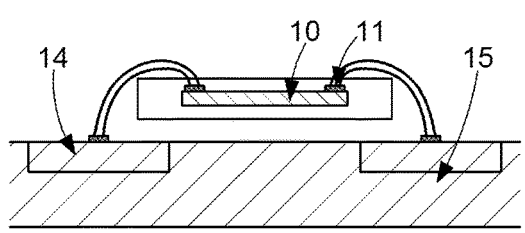
FIG. 2 schematically illustrates a side view of the package of FIG. 1
Figure 3:
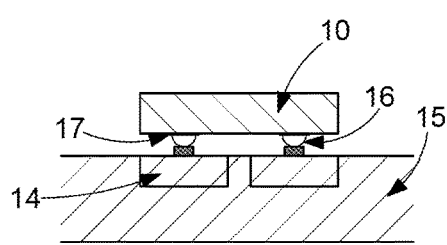
FIG. 3 schematically illustrates a side view of a classical flip-chip package
Figure 4:
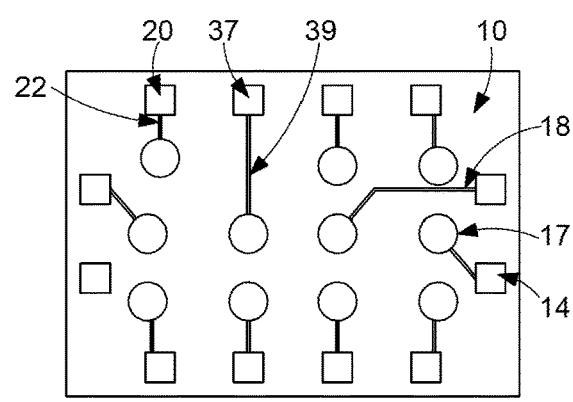
FIG. 4 schematically illustrates an integrated circuit die according to the state of the art FIG. 5 schematically illustrates an integrated circuit die according to a non-limited embodiment of the invention FIG. 6 schematically illustrates the integrated circuit die of FIG. 5 used to prevent said die from being tested after a flip-chip packaging.
Figure 5:
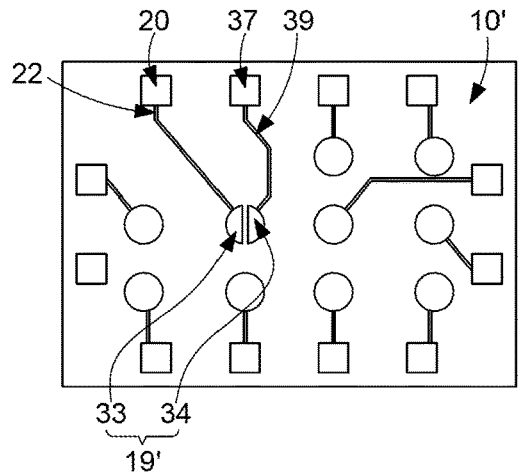

FIG. 5 shows an integrated circuit die 10' similar to the integrated circuit die 10 of FIG. 4, with the difference that it comprises a solder pad 19' that is split in half. More precisely, the solder pad 19' comprises a first portion 33 and a second portion 34 facing each other, each having a shape of a demi-disk. The first portion 33 is connected to the VSS bond pad 20 via the redistribution wire 22, and the second portion 34 is connected to the test bond pad 37 via the redistribution wire 39.

When no solder ball is placed onto the solder pad 19', the first portion 33 and the second portion 34 are not in electrical contact with each other. However, when a solder ball is placed onto the solder pad 19', the first portion 33 and the second portion 34 become in electrical contact with each other. Naturally, the portions 33, 34 may have another shape or be laid out differently on the die 10', as long as a single solder ball can establish an electrical contact between them.

Figure 6:
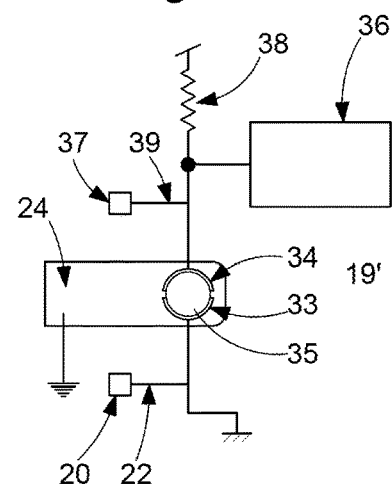

The key feature of the invention is that the electrical connections between the bond pads linked to the different portions are different depending on whether a solder ball is placed on the solder pad 19' or not. As a consequence, the split solder pad 19' may be used in order to prevent the integrated circuit die 10' from being tested after a flip-chip packaging, as illustrated on FIG. 6. In this example, the VSS bond pad 20 is chip-grounded.

As long as no solder ball is placed onto the solder pad 19', the die may be tested via the test circuitry 36. In order to do this, one terminal of a resistance 38 is generally connected to the test bond pad 37, and a potential VSS with a high state ("1") is applied to the other terminal of the resistance 38. As a consequence, the test circuitry 36 is automatically enabled, and the die can be tested. However, after a solder ball 35 is placed onto the solder pad 19' in order to ground the VSS bond pad 20 via a printed circuit track 24, the test bond pad 37 becomes electrically connected to the VSS bond pad 20, and the test circuitry becomes disabled. This situation is wanted when the integrated circuit die is used in applications (that is to say after packaging), so as to avoid the die to enter a test mode.

What is claimed is:

1. An electronic system, comprising:
   an integrated circuit die having:
      at least two bond pads, and
      a redistribution layer having:
         at least one solder pad comprising a first and second portion being separated from each other to provide a separation space between the first and second portion and being configured to provide an electrical connection between each of the first and second portion by a solder ball disposed on the at least one solder pad, and to electrically isolate the first and second portion in an absence of the solder ball on the at least one solder pad, and
      at least two redistribution wires, each connecting a different one of the first and second portion to a different one of the at least two bond pads, a second bond pad of the at least two bond pads being connected via a second redistribution wire of the at least two redistribution wires to a second portion of the first and second portion of the at least one solder pad being dedicated to testing the integrated circuit die; and
   a grounded printed circuit board track,
   wherein the solder ball is disposed between the at least one solder pad and the grounded printed circuit board track, and
   wherein no redistribution wires traverse the separation space between the first and second portion.

2. The electronic system according to claim 1, wherein each of the first and second portion have a shape of a demi-disk.

* * * * *